United States Patent [19]
Ikegami et al.

[11] Patent Number: 5,470,764
[45] Date of Patent: Nov. 28, 1995

[54] METHOD OF MANUFACTURING A SEMICONDUCTOR DEVICE WITH HYDROGEN ION INTERCEPTING LAYER

[75] Inventors: Masaaki Ikegami; Tetsuo Higuchi, both of Hyogo, Japan

[73] Assignee: Mitsubishi Denki Kabushik Kaisha, Tokyo, Japan

[21] Appl. No.: 247,425

[22] Filed: May 23, 1994

Related U.S. Application Data

[62] Division of Ser. No. 960,650, Oct. 14, 1992, Pat. No. 5,327,224.

[30] Foreign Application Priority Data

May 20, 1992 [JP] Japan ..................... 4-127609

[51] Int. Cl.⁶ .................. H01L 21/265; H01L 21/02
[52] U.S. Cl. .................. 437/24; 437/60; 437/241; 437/978
[58] Field of Search .............. 437/60, 241, 978, 437/24, 60, 241, 978

[56] References Cited

U.S. PATENT DOCUMENTS

| 4,010,290 | 3/1977 | Boland ........................ 437/241 |
| 4,212,684 | 7/1980 | Brower . |
| 4,322,881 | 4/1982 | Enomoto et al. ............. 437/60 |
| 4,370,798 | 2/1983 | Lien et al. . |
| 4,455,737 | 6/1984 | Godejahn, Jr. ............... 437/60 |
| 4,466,172 | 8/1984 | Batra ........................... 437/60 |
| 4,466,177 | 8/1984 | Chao ........................... 437/60 |
| 4,897,368 | 1/1990 | Kobushi et al. .............. 437/241 |
| 4,903,096 | 2/1990 | Masuoka et al. . |
| 4,931,845 | 6/1990 | Ema . |
| 5,013,692 | 5/1991 | Ide et al. ..................... 437/241 |
| 5,047,826 | 9/1991 | Keller et al. . |
| 5,135,882 | 8/1992 | Karniewicz et al. . |
| 5,182,627 | 1/1993 | Chen et al. . |
| 5,214,497 | 5/1993 | Nanba et al. . |
| 5,250,456 | 10/1993 | Bryant ........................ 437/241 |
| 5,336,327 | 8/1994 | Lee ............................. 118/730 |
| 5,348,901 | 9/1994 | Chen et al. .................. 437/60 |

FOREIGN PATENT DOCUMENTS

| 0463174A1 | 1/1992 | European Pat. Off. . |
| 1-296656 | 11/1989 | Japan . |
| 3016165 | 1/1991 | Japan . |
| 3070170 | 3/1991 | Japan . |
| 2103880A | 2/1983 | United Kingdom . |

OTHER PUBLICATIONS

Copy of German Office Action (with English Translation) citing references in corresponding German divisional application.
IBM Technical Disclosure Bulletin, vol. 22, No. 12, May 1980.
M. K. Lee, C. Y. Lu, "On the Semi-Insulating Polycrystalline Silicon Resistor", Solid State Electronics, vol. 27, No. 11, pp. 995–1001, 1984.

Primary Examiner—George Fourson
Assistant Examiner—Brian K. Dutton
Attorney, Agent, or Firm—Lowe, Price, LeBlanc & Becker

[57] ABSTRACT

To manufacture a semiconductor device a first insulating oxide film and a second thicker insulating oxide film, which continues to the first insulating oxide film, are formed on a semiconductor substrate. The first and second insulating oxide films are covered by a polysilicon film selectively formed on a patterned nitride layer or formed over the semiconductor substrate. In the second case, a silicon nitride film is formed in the lowermost layer portion of the polysilicon film by implanting nitrogen ions and then applying a heat treatment. The polysilicon and silicon nitride films are patterned for forming first and second polysilicon resistance films on the first and second insulating oxide films, respectively. A first electrode is connected to the first polysilicon resistance film and a second electrode is connected to the second polysilicon resistance film. An insulating protection film formed over the semiconductor substrate covers the first and second polysilicon resistance films and the first and second electrodes.

9 Claims, 12 Drawing Sheets

METHOD OF MANUFACTURING A SEMICONDUCTOR DEVICE WITH HYDROGEN ION INTERCEPTING LAYER

This application is a division of application Ser. No. 07/960,650 filed Oct. 14, 1992, now U.S. Pat. No. 5,327,224.

BACKGROUND OF THE INVENTION

1. Field of the Invention

The present invention relates in general to a semiconductor device, and in particular to a semiconductor device which includes a first polysilicon resistance film and a second polysilicon resistance film and is improved so that both the resistance films may have equal resistances provided that they have the same pattern. The invention also relates to a manufacturing method of such semiconductor device.

2. Description of the Background Art

FIG. 16 shows an example of a constant voltage circuit used in a bipolar linear circuit. The linear circuit is a kind of monolithic ICs also called as analog IC handling continuous signals. An output voltage $V_O$ of the constant voltage circuit is a function of resistances $R_A$ and $R_B$ as shown in the following expression.

$$V_O = (R_A/R_B - 1)V_{BE}$$

where, $R_A$ and $R_B$ indicate the resistances of resistors formed of polysilicon, and $V_{BE}$ indicates a forward voltage of a transistor.

FIGS. 17 and 18 show layouts of patterns of the circuit shown in FIG. 16.

FIG. 26 is a cross section of a bipolar linear circuit device in the prior art. FIGS. 19–26 are cross sections showing a manufacturing method thereof. The manufacturing steps and a construction of the bipolar linear circuit in the prior art will be described.

Referring to FIG. 19, an $n^+$-type embedded diffusion layer 2 is formed in a surface of a P-type silicon substrate 1. An $n^-$-type epitaxial layer 3 is formed on the whole surface of the P-type silicon substrate 1.

Referring to FIG. 20, desired regions of the $n^-$-type epitaxial layer 3 are oxidized by a selective oxidization method to form thin insulating oxide films 4. Thin insulating oxide films 5 are formed in regions other than the thick insulating oxide films 4. The insulating oxide film 5 has a thickness of 50–100 nm, and the insulating oxide film 4 has a thickness of 800–1500 nm.

Referring to FIG. 21, a $P^+$-type element isolating layer 6 and a $p^+$ base layer 7 are formed in regions surrounded by the insulating oxide films 4. Referring to FIG. 22, a polysilicon film 8 of about 50–500 nm in thickness is deposited on the insulating oxide film 4 and thin insulating oxide film 5 by low pressure CVD method at a temperature of 500°–700° C. n-type or p-type impurity is introduced into the polysilicon film 8, e.g., by diffusion or ion implantation, thereby the resistance of polysilicon film 8 is controlled to be in a range from several tens $\Omega/\square$ to several hundreds $k\Omega/\square$.

Referring to FIG. 23, photolithography is used to form a photo resist pattern 9 on the polysilicon film 8. Using the photo resist pattern 9 as a mask, unnecessary polysilicon film is removed by the etching using Freon gas plasma, thereby a first polysilicon resistance film 8b is formed on the thin insulating oxide film 5, and a second polysilicon resistance film 8a is formed on the thick insulating oxide film 4. Thereafter, the photo resist pattern 9 is removed.

Referring to FIG. 24, the CVD method is used to deposit an insulating oxide film 10 on the whole surface of the silicon substrate 1. The photolithography and etching are used to selectively remove the insulating oxide film 10 and thin insulating oxide film 5 located in emitter and collector regions of the bipolar transistor. Thereafter, n-type impurity is diffused to form an $n^+$ emitter layer 11a and an $n^+$ collector layer 11b.

Referring to FIG. 25, the photolithography and etching are used to form openings, which reach the $P^+$ base layer 7, first polysilicon resistance film 8a and second polysilicon resistance film 8b, respectively, in the insulating oxide film 10. Then, metal electrodes 12 are formed, which are connected through these openings to $n^+$ emitter layer 11a, $p^+$ base layer 7, $n^+$ collector layer 11b, first polysilicon resistance film 8b and second polysilicon film 8a, respectively.

Referring to FIG. 26, a plasma nitride film 13 is formed as a final protection film on the whole surface of the silicon substrate 1 by a low-temperature plasma enhanced CVD method at a temperature of 250°–400° C. using gas containing $SiH_4+NH_3$. The plasma nitride film 13 obtained by the low-temperature plasma enhanced CVD method contains a large amount of hydrogen ion ($H^+$).

Although not shown, the photolithography and etching technique are then used to remove the plasma nitride film 13 located on a bonding pad to form the bonding pad. After the subsequent thermal processing at 350° C.–450° C. and a series of manufacturing steps of the semiconductor device, the semiconductor device is completed.

Since the bipolar linear circuit device in the prior art has the construction described above, it has following problems.

FIG. 27 is an enlarged view of a portion in which the first and second polysilicon resistance films 8b and 8a in FIG. 26 exist.

Referring to FIG. 27, the heat treatment is applied to the plasma nitride film 13 deposited on the silicon substrate 3, and the hydrogen ion ($H^+$) contained in the plasma nitride film 13 is supplied to grain interfaces in the first and second polysilicon resistance films 8b and 8a. In this case, the amounts of the hydrogen ion supplied to the polysilicon resistance films 8a and 8b from the upper side are substantially equal to each other. However, the amounts of the hydrogen ion supplied into the polysilicon resistance films 8a and 8b from the lower sides are different from each other. Specifically, the thin insulating oxide film 5 is disposed under the first polysilicon resistance film 8b, and the thick insulating oxide film 4 is formed under the second polysilicon resistance film 8a. Therefore, a larger amount of hydrogen ion is supplied through the thick insulating oxide film 4 into the second polysilicon resistance film 8a. As a result, the resistance $R_A$ of the second polysilicon resistance film 8a is lower than the resistance $R_B$ of the first polysilicon resistance film 8b. Generally, the resistance $R_A$ is lower than the resistance $R_B$ by approximately 10%.

As stated above, the output voltage $V_O$ of the constant voltage circuit depends on the resistances $R_A$ and $R_B$ and the forward voltage $V_{BE}$ of the transistor. Therefore, if the amounts of the supplied hydrogen ion are different from each other, the resistances $R_A$ and $R_B$ unequally change, and thus the output voltage $V_O$ intended by the circuit design cannot be obtained.

SUMMARY OF THE INVENTION

An object of the invention is to provide a semiconductor device which includes two kinds of polysilicon resistance films and is so improved that resistances of these polysilicon resistance films are equal to each other even if the insulating oxide films under the polysilicon resistance films have different thicknesses, provided that they have the same pattern.

Another object of the invention is to provide an improved bipolar linear circuit device in which an output intended by a circuit design can be obtained.

Still another object of the invention is to provide a manufacturing method suitable to such semiconductor device.

Yet another object of the invention is to provide a method for obtaining a pattern of a polysilicon resistance film having a strong bonding force between a polysilicon film and a silicon nitride film formed under the same.

Still another object of the invention is to provide a method for obtaining a pattern of a polysilicon resistance film having a uniform film thickness and a high dimensional accuracy.

Accordingly, a first aspect of the invention provides a semiconductor device, which includes a semiconductor substrate and a first insulating oxide film disposed on the semiconductor substrate. A second insulating oxide film, which continues to the first insulating oxide film and has a film thickness larger than that of the first insulating oxide film, is formed on the semiconductor substrate. A first polysilicon resistance film is deposited on the first insulating oxide film. A second polysilicon resistance film is formed on the second insulating oxide film. A first electrode, which is electrically connected to the first polysilicon resistance film, is formed on the semiconductor substrate. A second electrode, which is electrically connected to the second polysilicon resistance film, is formed on the semiconductor substrate. The semiconductor device includes an insulating protection film which is located on the semiconductor substrate and covers the first polysilicon resistance film, the second polysilicon resistance film, the first electrode and the second electrode. A hydrogen ion intercepting film, which prevents passage of hydrogen ion, is interposed between the first insulating oxide film and the first polysilicon resistance film and between the second insulating oxide film and the second polysilicon resistance film.

A second aspect of the invention provides a semiconductor device, which includes a semiconductor substrate and a first insulating oxide film formed on the semiconductor substrate. A second insulating oxide film, which continues to the first insulating oxide film and has a film thickness larger than that of the first insulating oxide film, is formed on the semiconductor substrate. A first polysilicon resistance film is formed on the first insulating oxide film. A second polysilicon resistance film is formed on the second insulating oxide film. A hydrogen ion intercepting film, which prevents passage of hydrogen ion and covers the first polysilicon resistance film and the second polysilicon resistance film, is formed on the semiconductor substrate. The hydrogen ion intercepting film is provided with a first opening for partially exposing a surface of the first polysilicon resistance film and a second opening for partially exposing a surface of the second polysilicon resistance film. A first electrode is electrically connected through the first opening to the first polysilicon resistance film. A second electrode is electrically connected through the second opening to the second polysilicon resistance film. An insulating protection film, which covers the first polysilicon resistance film, the second polysilicon resistance film, the first electrode and the second electrode, is formed on the semiconductor substrate.

A third aspect of the invention provides a semiconductor device, which includes a semiconductor substrate and a first insulating oxide film formed on the semiconductor substrate. A second insulating oxide film, which continues to the first insulating oxide film and has a film thickness larger than that of the first insulating oxide film, is formed on the semiconductor substrate. A first polysilicon resistance film is formed on the first insulating oxide film. A second polysilicon resistance film is formed on the second insulating oxide film. A third insulating oxide film, which covers the first and second polysilicon resistance films, is formed on the semiconductor substrate. A hydrogen ion intercepting film, which prevents passage of hydrogen ion, is formed on the semiconductor substrate. The hydrogen ion intercepting film and the third insulating oxide film are provided with a first opening for partially exposing a surface of the first polysilicon resistance film and a second opening for partially exposing a surface of the second polysilicon resistance film. A first electrode is electrically connected through the first opening to the first polysilicon resistance film. A second electrode is electrically connected through the second opening to the second polysilicon resistance film. An insulating protection film, which covers the first polysilicon resistance film, the second polysilicon resistance film, the first electrode and the second electrode, is formed on the semiconductor substrate.

A fourth aspect of the invention provides a manufacturing method of a semiconductor device, in which a first insulating oxide film and a second insulating oxide film, which continues to the first insulating oxide film and has a film thickness larger than that of the first insulating oxide film, is formed on a semiconductor substrate. Then, a polysilicon film, which covers the first and second insulating oxide films, is formed on the semiconductor substrate. Nitrogen ions are implanted into a lowermost layer portion of the polysilicon film, and then a heat treatment is applied thereto, whereby a silicon nitride film is formed in the lowermost layer portion of the polysilicon film. The polysilicon film and the silicon nitride film are patterned, whereby a first polysilicon resistance film is formed on the first insulating oxide film, and a second polysilicon resistance film is formed on the second insulating oxide film. A first electrode connected to the first polysilicon resistance film and a second electrode connected to the second polysilicon resistance film are formed. An insulating protection film, which covers the first polysilicon resistance film, the second polysilicon resistance film, the first electrode, and the second electrode, is formed on the semiconductor substrate.

A fifth aspect of the invention provides a manufacturing method of a semiconductor device, in which a first insulating oxide film and a second insulating oxide film, which continues to the first insulating oxide film and has a film thickness larger than that of the first insulating oxide film, is formed on a semiconductor substrate. Then, a pattern of a first silicon nitride film is formed on the first insulating oxide film, and a pattern of a second silicon nitride film is formed on the second insulating oxide film. Polysilicon films are selectively grown on the respective patterns of the first and second silicon nitride films, whereby a first polysilicon resistance film is formed on the first insulating oxide film and a second polysilicon resistance film is formed on the second insulating oxide film. A first electrode connected to the first polysilicon resistance film and a second electrode connected to the second polysilicon resistance film are formed. An insulating protection film, which covers the first polysilicon resistance film, the second polysilicon resistance film, the first electrode, and the second electrode, is formed on the semiconductor substrate.

In the semiconductor device according to the first aspect of the invention, since the hydrogen ion intercepting film, which prevents the passage of hydrogen ion, is interposed between the first insulating oxide film and the first polysilicon resistance film and between the second insulating oxide film and the second polysilicon resistance film, the hydrogen ion intercepting film intercepts the hydrogen ion which tends to move into these polysilicon resistance films from the lower sides thereof.

In the semiconductor device according to the second aspect of the invention, since the hydrogen ion intercepting film, which prevents the passage of the hydrogen ion and covers the first polysilicon resistance film and the second polysilicon resistance film, is provided on the semiconductor substrate, the hydrogen ion in the insulating protection film does not move into the polysilicon resistance film.

In the semiconductor device according to the third aspect of the invention, since the hydrogen ion intercepting film, which prevents the passage of the hydrogen ion, is provided on the third insulating film, the hydrogen ion in the insulating protection film is intercepted by the hydrogen ion intercepting film and does not move into the polysilicon resistance film.

In the manufacturing method of the semiconductor device according to the fourth aspect of the invention, the nitrogen ion is implanted into the lowermost layer portion of the polysilicon film, and then the heat treatment is applied thereto, whereby the silicon nitride film is formed in the lowermost layer portion of the polysilicon film, so that the semiconductor device can have a strong bonding force between the polysilicon film and the silicon nitride film.

In the manufacturing method of the semiconductor device according to the fifth aspect of the invention, the polysilicon films are selectively grown on the respective patterns of the first and second silicon nitride films to form the first and second polysilicon resistance films, whereby the semiconductor device having a uniform film thickness and a high dimensional accuracy is obtained.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENT

Embodiments of the invention will be described below with reference to the drawings.

Figure 1:
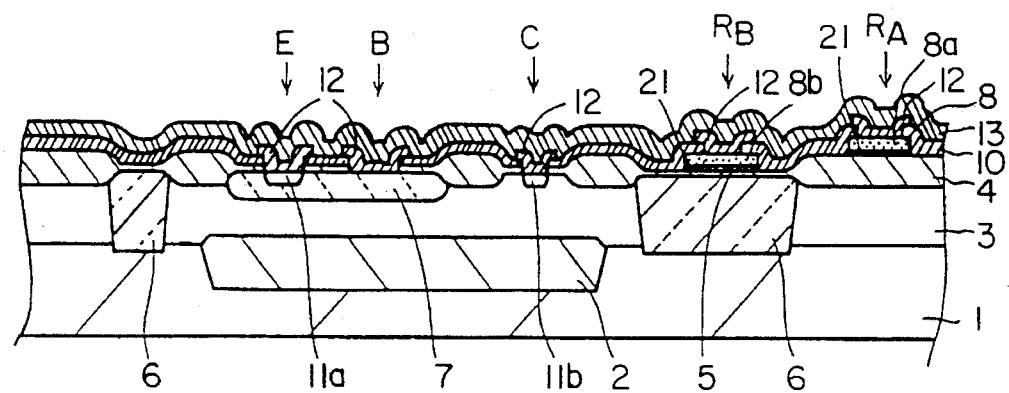
FIG. 1 is a cross section of a semiconductor device according to a first embodiment of the invention.

FIG. 1 is a cross section of a bipolar linear circuit device according to an embodiment of the invention. A semiconductor device shown in FIG. 1 is similar to the conventional semiconductor device shown in FIG. 26, except the following points. The same parts and portions are denoted by the same reference numerals, and description thereof is not repeated. The semiconductor device shown in FIG. 1 differs from the conventional semiconductor device shown in FIG. 26 in that hydrogen ion intercepting films 21 which prevent the passage of hydrogen ion are interposed between the thin first insulating oxide film 5 and the first polysilicon resistance film 8b, and between the thick second insulating oxide film 4 and the second polysilicon resistance film 8a, respectively.

For example, the hydrogen ion intercepting films 21 are $Si_3N_4$ films formed by low pressure CVD method.

Figure 2:
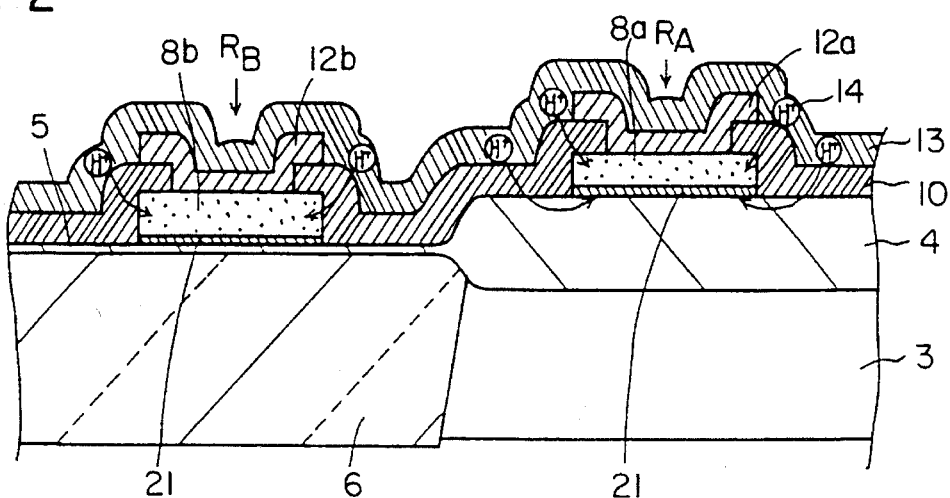
FIG. 2 is an enlarged diagram of a portion of a semiconductor device shown in FIG. 1, in which polysilicon resistance films exist.

FIG. 2 is an enlarged diagram showing a portion in which the polysilicon resistance films of the semiconductor device shown in FIG. 1 exist. In the figure, 12b denotes a first electrode connected to the first polysilicon resistance film 8b, and 12a denotes a second electrode connected to the second polysilicon resistance film 8a.

Figure 18:
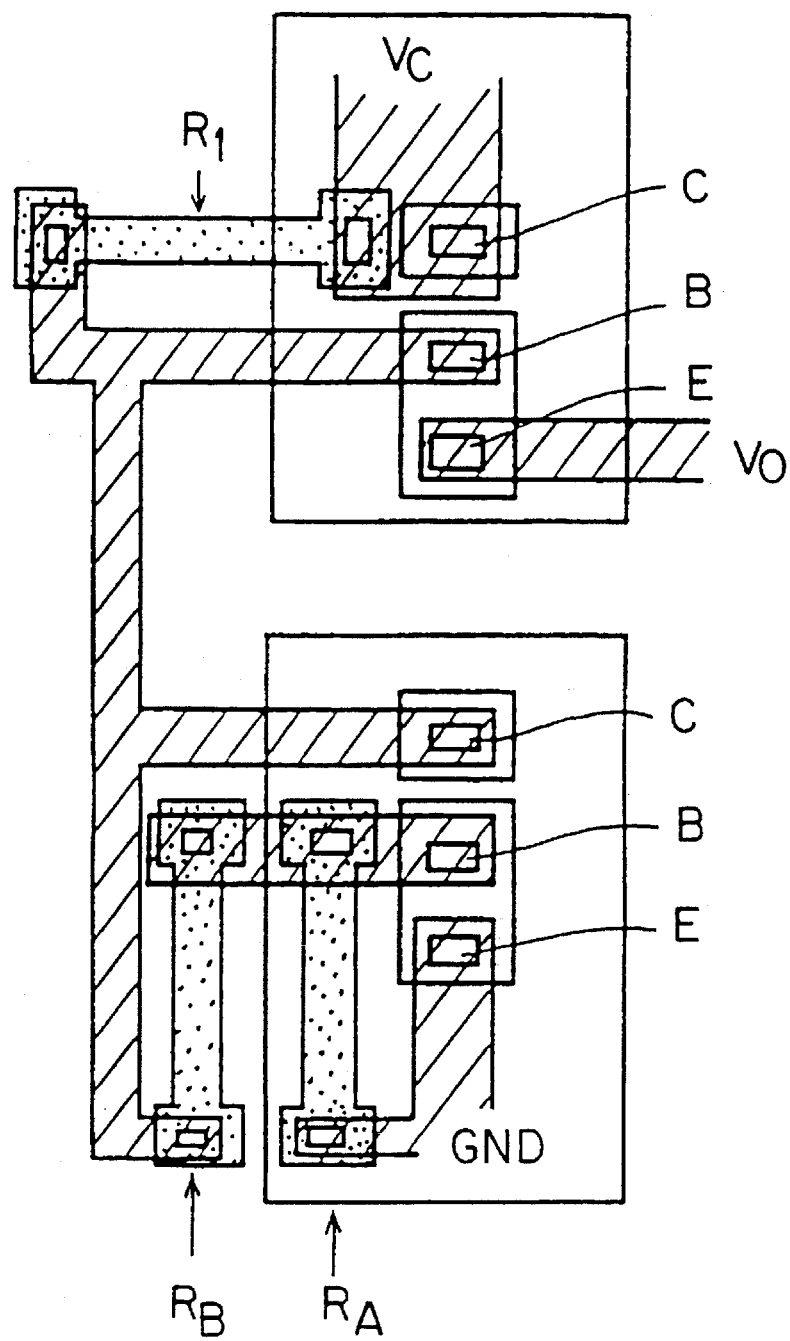
FIG. 18 shows a second example of a prior art pattern layout of a circuit shown in FIG. 16.
Figure 19:
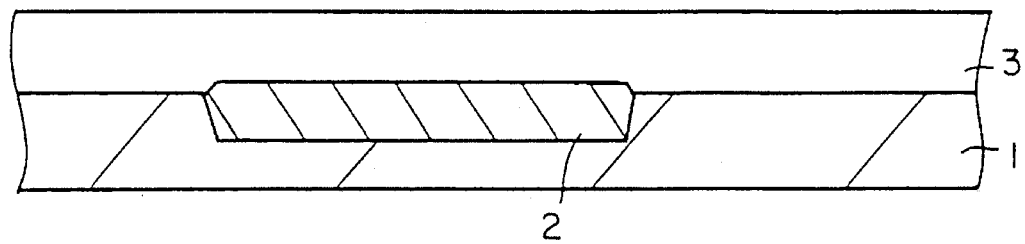
FIGS. 19 to 26 are fragmentary cross sections of a prior art semiconductor device in first to eighth steps of a manufacturing method of a semiconductor device in the prior art.
Figure 20:
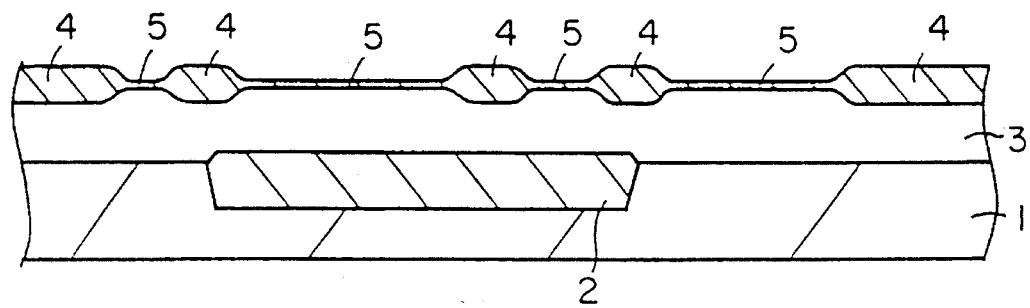
Figure 21:
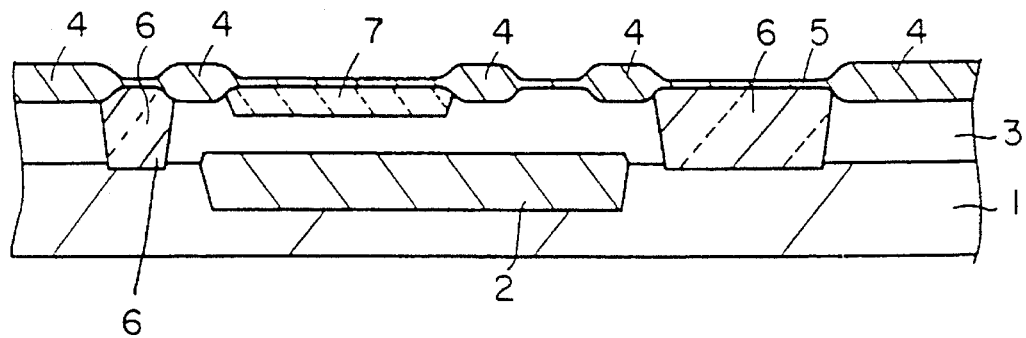
Figure 22:
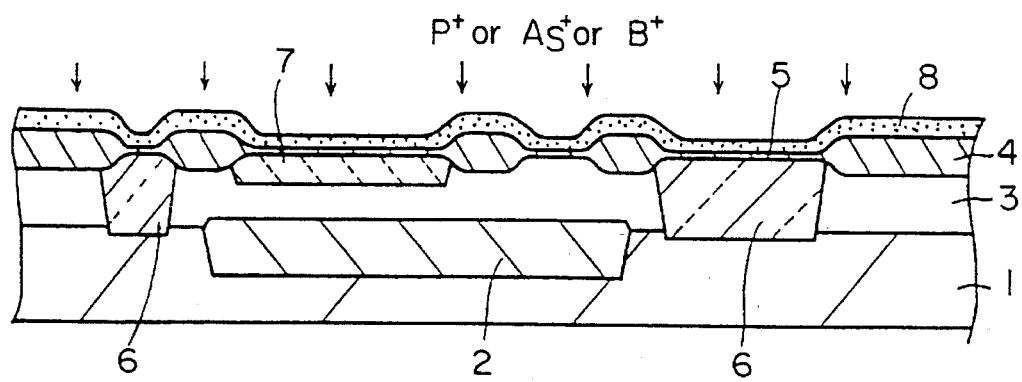
Figure 23:
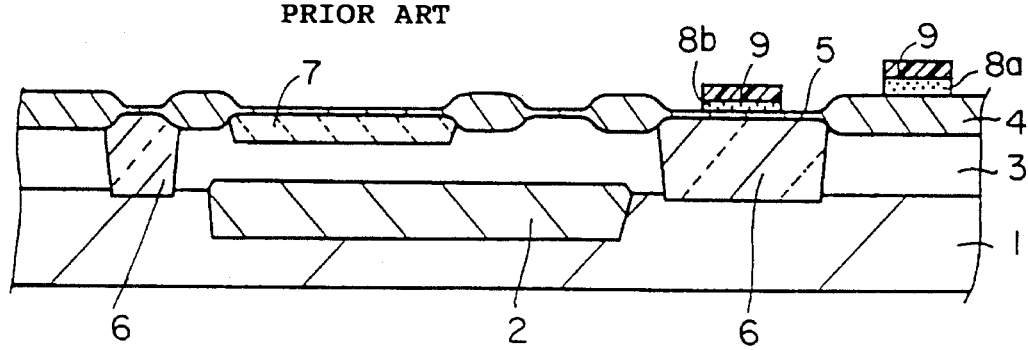

Referring to FIG. 2, hydrogen ion intercepting films 21 are provided under the polysilicon resistance films 8a and 8b, respectively, so that the hydrogen ion, which coming down from the final insulating protection film 13 and goes upward, is intercepted by the hydrogen ion intercepting films 21. Since the amounts of the hydrogen ion moving into the polysilicon resistance films 8a and 8b are equal to each other, no difference is caused between the resistances $R_A$ and $R_B$. Therefore, even in the constant voltage circuit having, a pattern layout shown e.g., in FIG. 18, an output equal to a designed value can be obtained.

Figure 3:
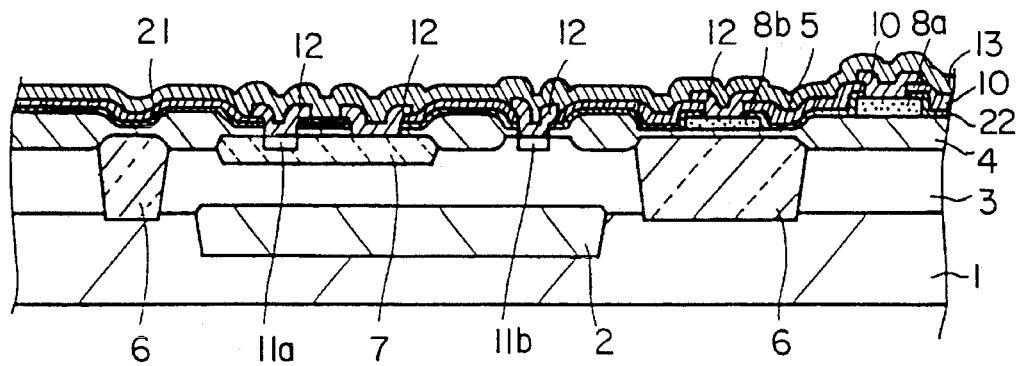
FIG. 3 is a cross section of a semiconductor device according to a second embodiment of the invention.

FIG. 3 is a cross section of a semiconductor device according to a second embodiment of the invention. The semiconductor device shown in FIG. 3 is similar to the bipolar linear circuit device shown in FIG. 26, except the following points. The same parts and portions are denoted by the same reference numerals, and description is not repeated.

Figure 26:
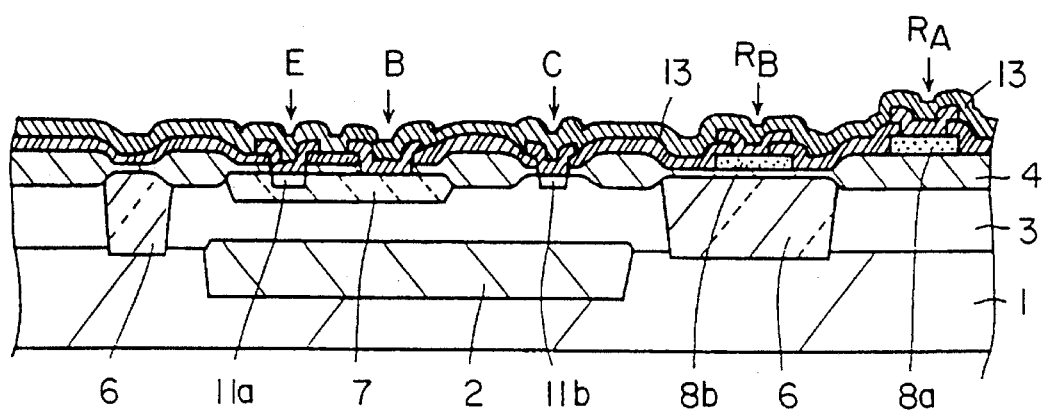
Figure 27:
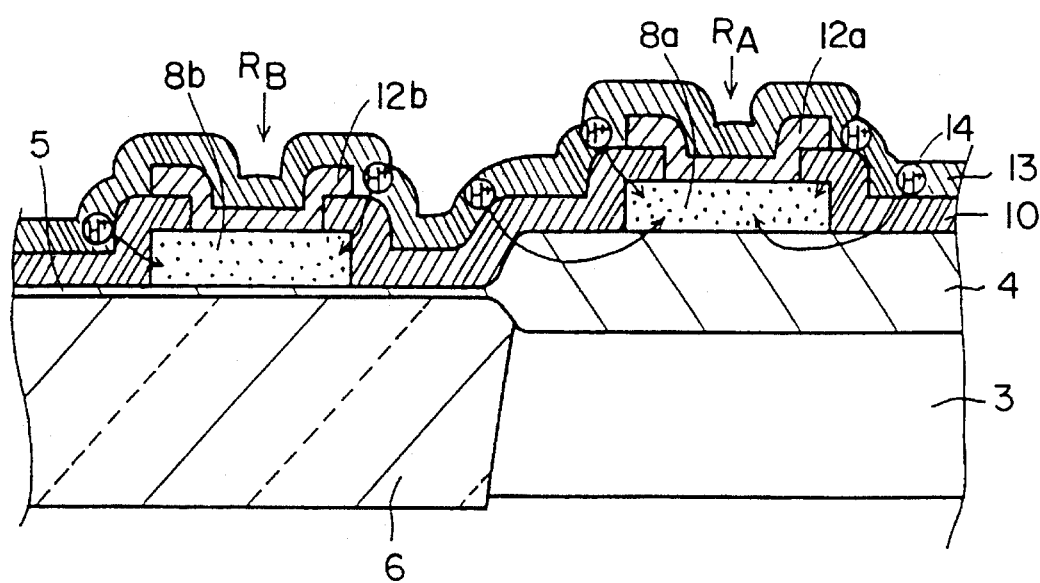
FIG. 27 shows a semiconductor device for explaining a problem in the prior art.

The semiconductor device shown in FIG. 3 differs from the bipolar linear circuit device shown in FIG. 26 in that the $Si_3N_4$ film 21 (silicon nitride film), which is formed by the CVD method and prevents the passage of the hydrogen ion, is formed on the silicon substrate 1 and covers the first and second polysilicon resistance films 8b and 8a.

Figure 4:
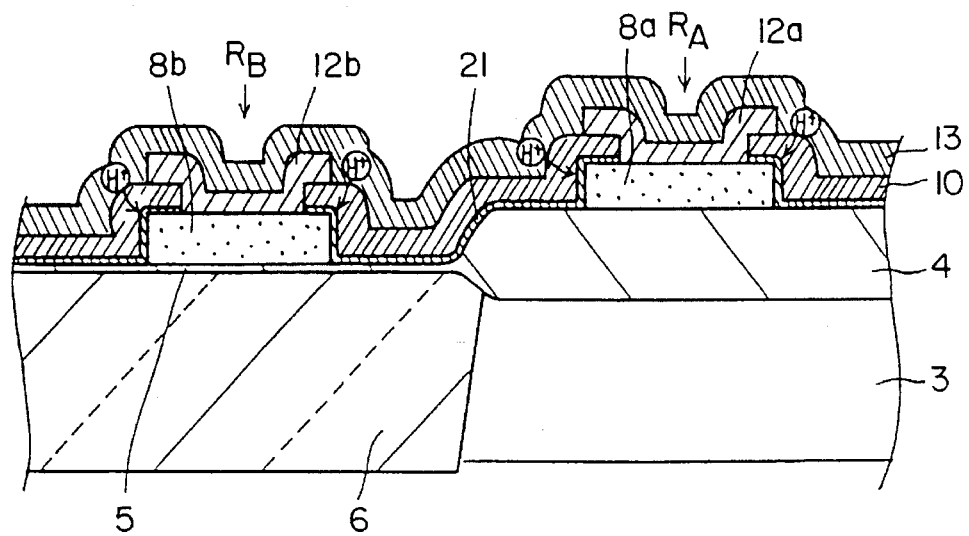
FIG. 4 is an enlarged diagram of a portion of a semiconductor device shown in FIG. 3, in which polysilicon resistance films exist.

FIG. 4 is an enlarged diagram showing a portion in which the polysilicon resistance films of the semiconductor device shown in FIG. 2 exist. In the semiconductor device according to the second embodiment, the $Si_3N_4$ film 21 completely intercepts the hydrogen ion which tends to move into the polysilicon resistance films 8a and 8b from the upper side. Therefore, no difference is caused between the resistances $R_B$ and $R_A$ of the first and second polysilicon resistance films 8b and 8a.

Figure 5:
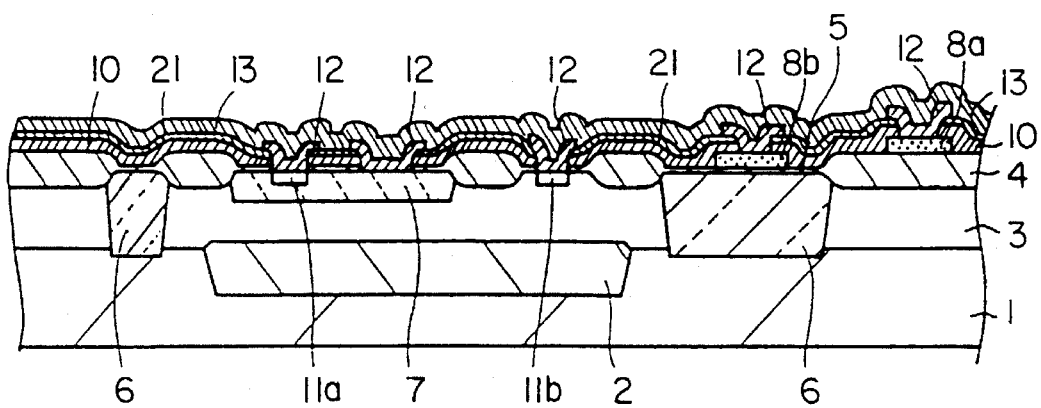
FIG. 5 is a cross section of a semiconductor device according to a third embodiment of the invention.

FIG. 5 is a cross section of a semiconductor device according to a third embodiment of the invention. The semiconductor device shown in FIG. 5 is similar to the bipolar linear circuit device shown in FIG. 26 except the following points. The same parts and portions are denoted by the same reference numerals, and description is not repeated.

Figure 6:
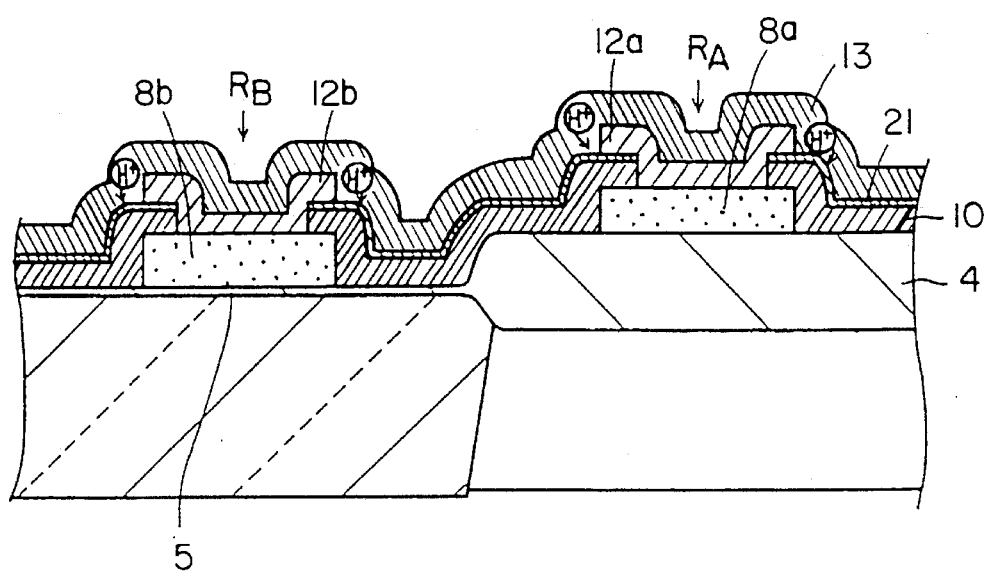
FIG. 6 is an enlarged diagram of a portion of a semiconductor device shown in FIG. 5, in which polysilicon resistance films exist.

The semiconductor device shown in FIG. 5 differs from the semiconductor device shown in FIG. 26 in that the $Si_3N_4$ film 21, which is formed by the low pressure CVD method and intercepts the hydrogen ion, is provided on the insulating oxide film 10. FIG. 6 is an enlarged diagram of a portion in which the polysilicon resistance films of the semiconductor device shown in FIG. 5 exist. Referring to FIG. 6, since the $Si_3N_4$ film 21 is deposited on the insulating oxide film 10, the hydrogen ion, which tends to move into the polysilicon resistance films 8a and 8b from the upper side, is completely intercepted. As a result, no difference is caused between the resistances $R_B$ and $R_A$ of the first and second polysilicon resistance films 8b and 8a.

Now, a manufacturing method of the semiconductor device shown in FIG. 1 will be described below with reference to FIGS. 7–12.

Figure 7:
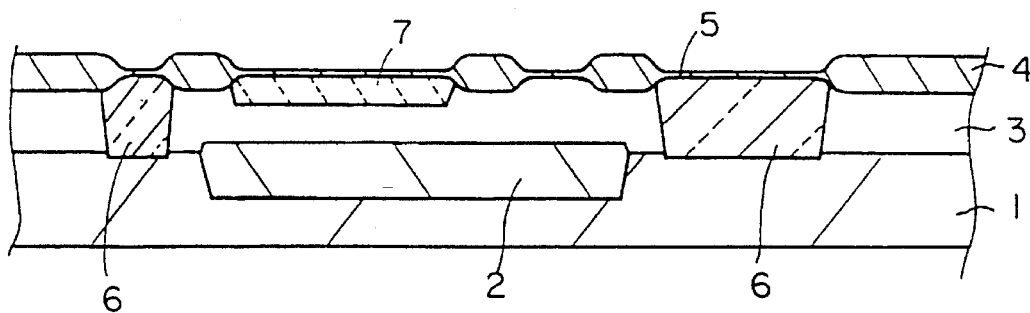
FIGS. 7 to 12 are fragmentary cross sections of a semiconductor device in first to sixth steps of a manufacturing method according to an embodiment of the invention.

Referring to FIG. 7, the $n^+$-type buried diffusion layer 2, $n^-$-type epitaxial layer 3, thick insulating oxide film 4, thin insulating oxide film 5, $p^+$-type element isolating layer 6, and $p^+$ base layer 7 are formed on the p-type silicon substrate 1.

Figure 8:
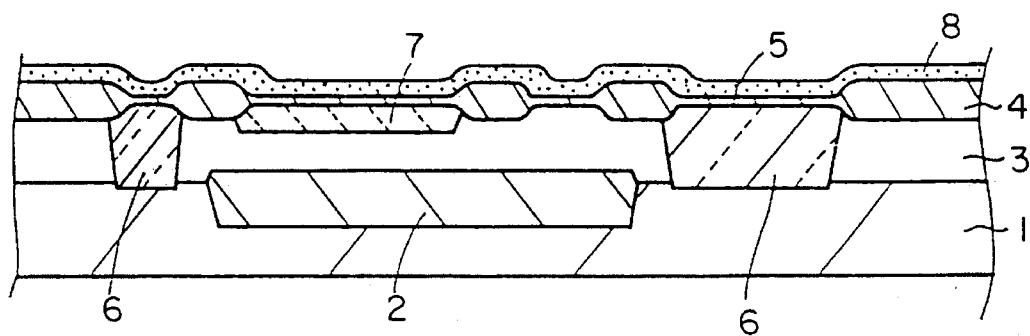

Referring to FIG. 8, the polysilicon layer 8 is formed on the whole surface of the silicon substrate 1 by the low pressure CVD method. In this step, the film thickness of the polysilicon layer 8 is determined, taking such a fact into account that the lowermost layer portion thereof will change into the $Si_3N_4$ film of 30–100 nm in thickness as will be described later.

Figure 9:
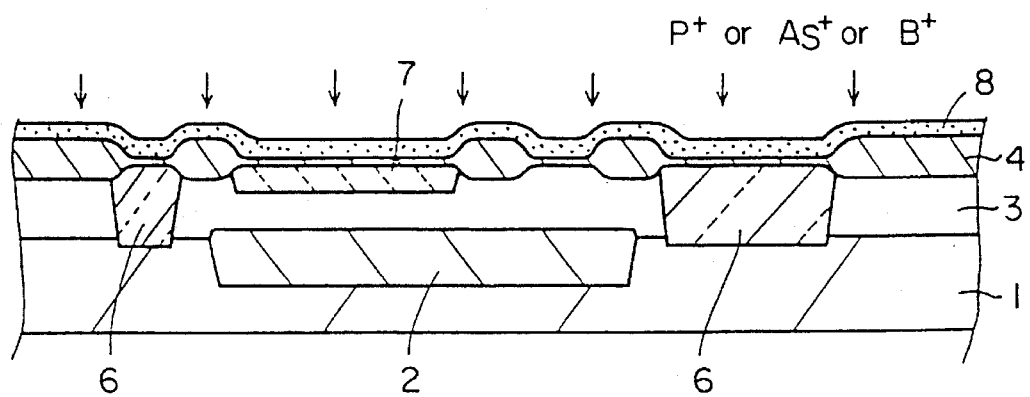

Referring to FIG. 9, impurity is implanted into the polysilicon film 8 to control the polysilicon layer 8 to have a resistance in a range from about several tens $\Omega/\square$ to several hundreds $k\Omega/\square$.

Figure 10:
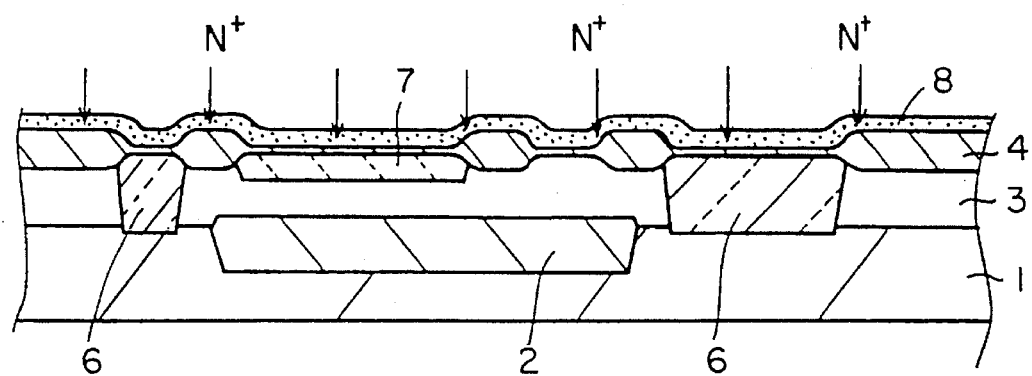

Referring to FIG. 10, $N^+$ ion is implanted at a high energy of 500 keV–5 MeV into the main surface of polysilicon layer 8. Thereby, $N^+$ ion is introduced into the lowermost layer portion of polysilicon layer 8.

Figure 11:
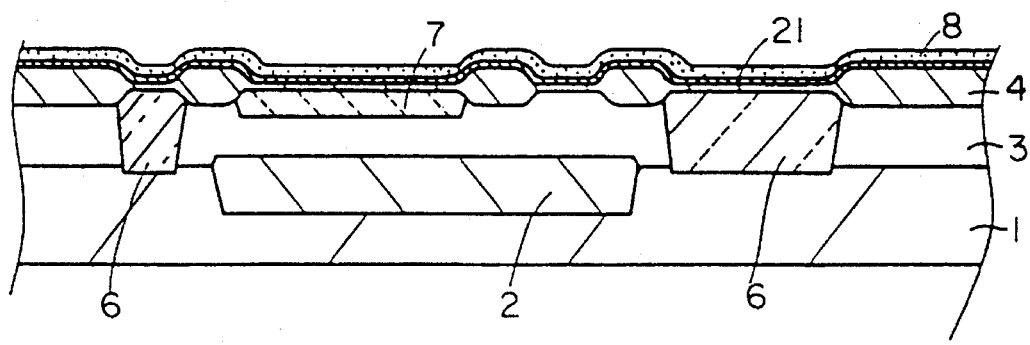

Referring to FIG. 11, heat treatment at 500°–850° C. is applied to the lowermost layer portion of polysilicon layer 8 to change the same into $Si_3N_4$ film 21. $Si_3N_4$ film 21 has a thickness of 30–100 nm. In this method, the interface between the polysilicon layer 8 and the $Si_3N_4$ film 21 has a stable structure, and thus they have a strong bonding force. In the prior art, the two-layer structure formed of the polysilicon film and $Si_3N_4$ film requires two steps, i.e., a step of depositing the $Si_3N_4$ film and a step of depositing the polysilicon film. In this prior art method, impurity is liable to be trapped at the interface between the polysilicon film and $Si_3N_4$ film or film separation is liable to be caused. The method according to the embodiment prevents such disadvantages.

Figure 12:
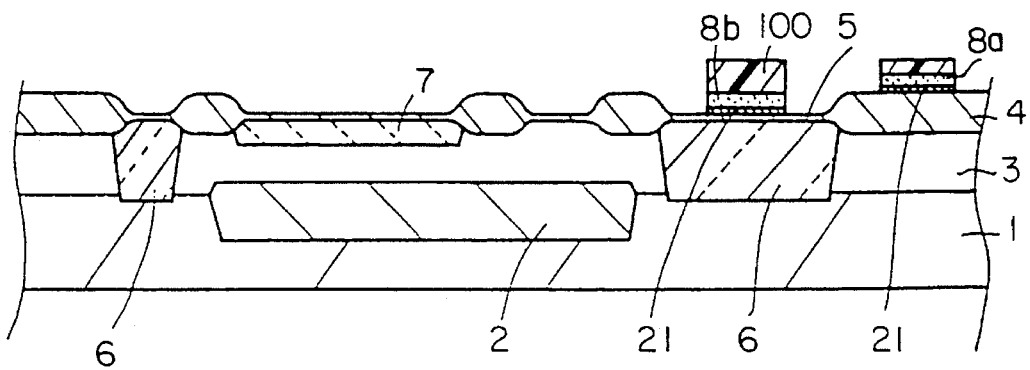
Figure 24:
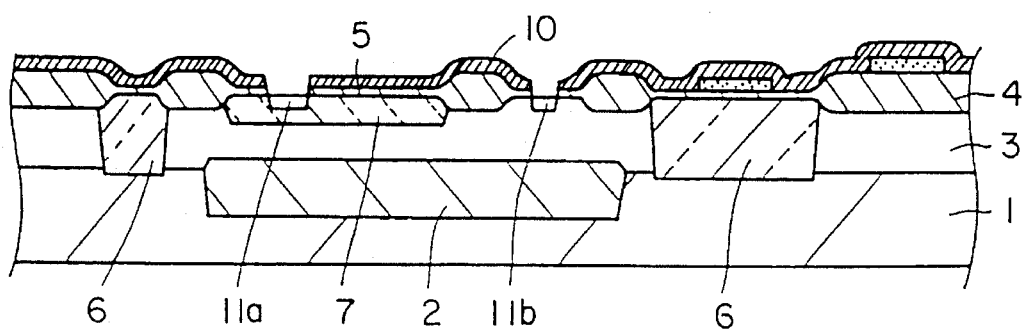
Figure 25:
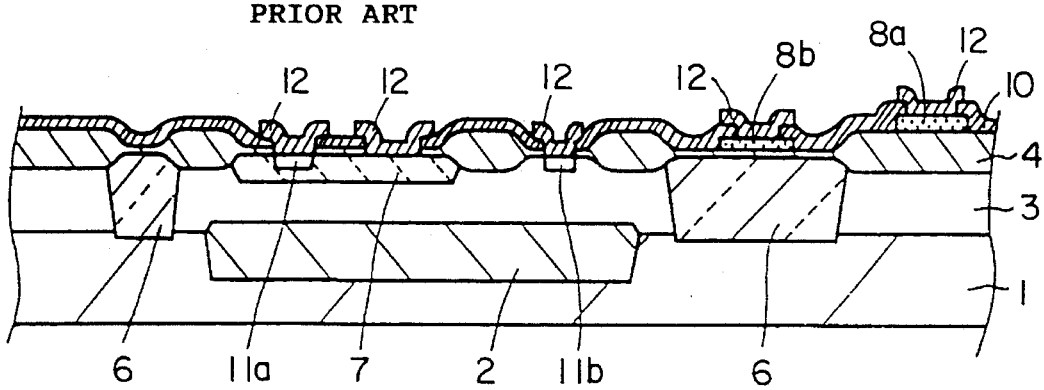

Referring to FIG. 12, a resist pattern 100 is formed on the polysilicon film 8. Then, anisotropic etching with $SF_6$ or $CCl_4$ gas is applied to the polysilicon layer 8, using a photo resist pattern 100 as a mask. Thereafter, reaction gas is replaced and the etching with $CF_4+O_2$ gas plasma is applied to the $Si_3N_4$ film 21. This method requires change of the reaction gas only, so that the etching processes do not require a lot of time and labor and the polysilicon resistance film of a high dimensional accuracy can be obtained. Thereafter, processes similar to those shown in FIGS. 24–26 are carried out, whereby the semiconductor device shown in FIG. 1 is obtained.

Figure 13:
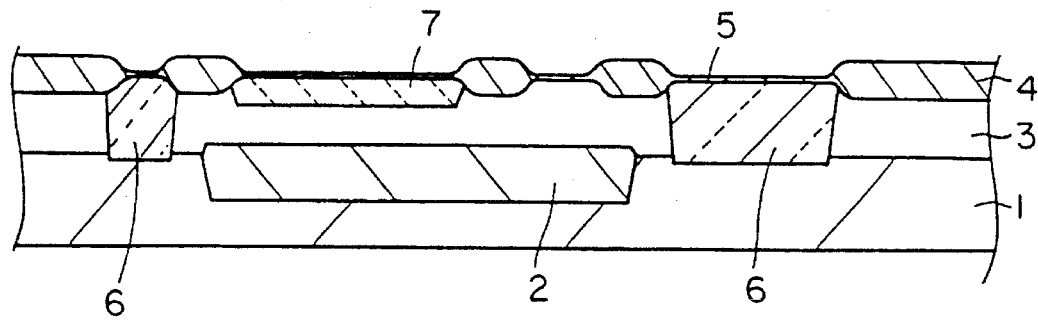
FIGS. 13 to 15 are fragmentary cross sections of a semiconductor device in first to third steps of a manufacturing method according to another embodiment of the invention.
Figure 14:
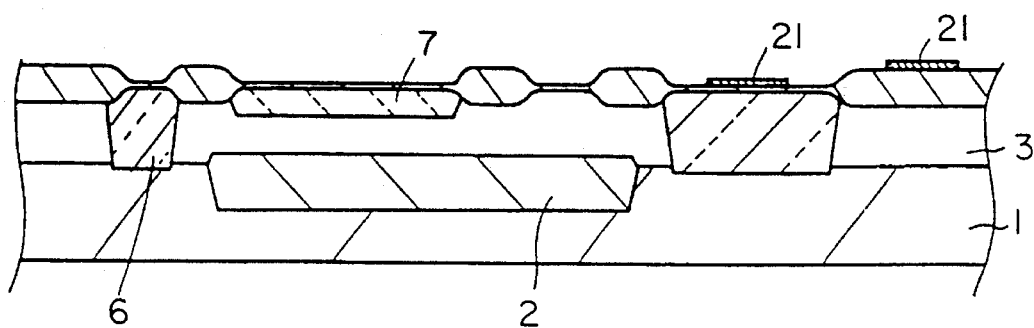
Figure 15:
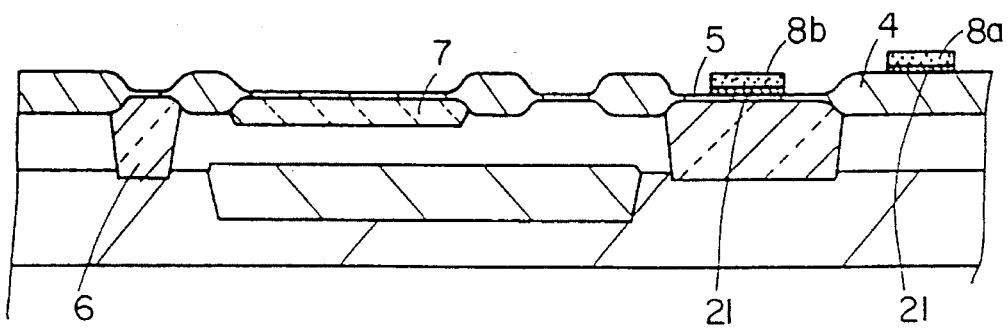
Figure 16:
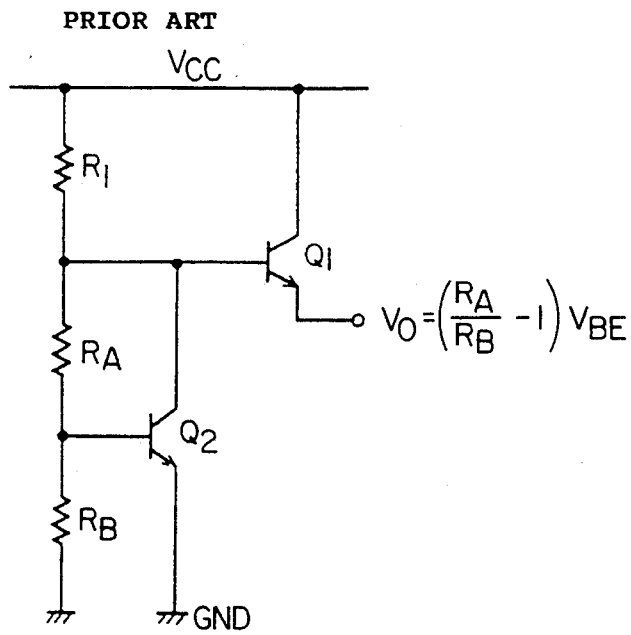
FIG. 16 shows an example of a prior art constant voltage circuit used in a bipolar linear circuit device.
Figure 17:
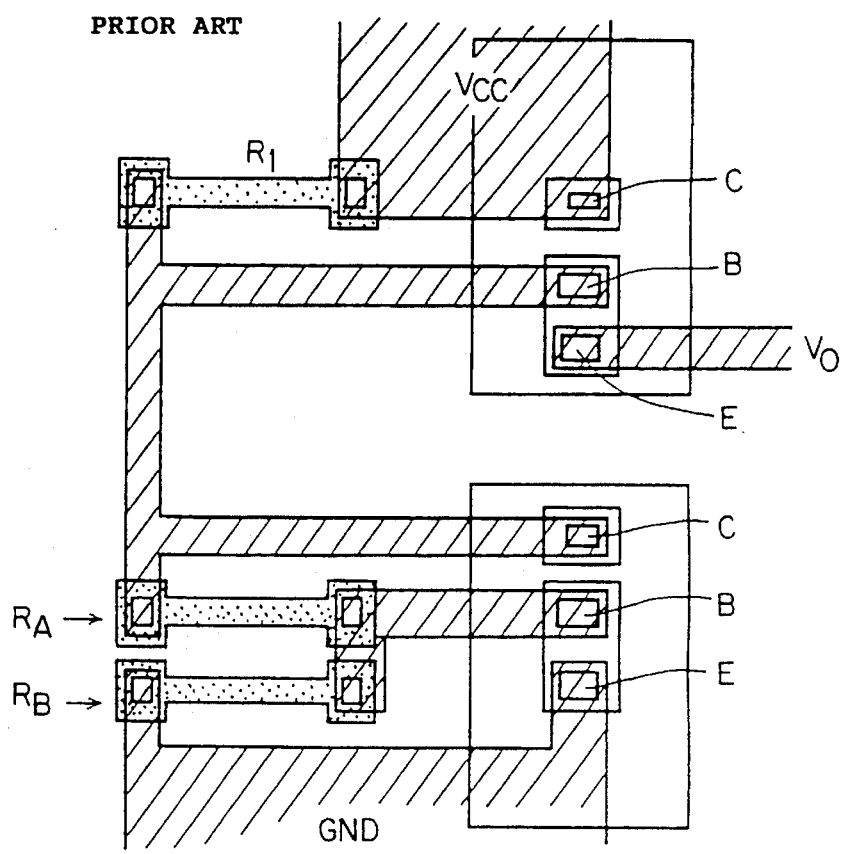
FIG. 17 shows a first example of a prior art pattern layout of a circuit shown in FIG. 16.

FIGS. 13–15 show major steps in a second manufacturing method of a semiconductor device shown in FIG. 1.

Referring to FIG. 13, $n^+$-type buried diffusion layer 2, $n^-$-type epitaxial layer 3, thick insulating oxide film 4, thin insulating oxide film 5 and $p^+$-type element isolating layer 6 and $p^+$ base layer 7 are formed on the P-type silicon substrate 1.

Referring to FIG. 14, the $Si_3N_4$ film 21 is formed on the whole surface of the silicon substrate 1 by the low pressure CVD method. $Si_3N_4$ film 21 is subjected to the photolithography and etching for patterning the same.

Referring to FIG. 15, the polysilicon films 8a and 8b are selectively grown on the $Si_3N_4$ film 21. This selective growth of the polysilicon films is enabled by using silicon material containing halogen element such as Cl or Br and utilizing a difference of the energy of formation of silicon nucleus on $Si_3N_4$ film 21 and energy of formation of silicon nucleus on the insulating oxide films 4 and 5. Thereafter, the impurity is introduced into the first and second polysilicon resistance films 8a and 8b so that they have intended resistances. Thereafter, processing steps similar to those shown in FIGS. 24–26 are applied to obtain the semiconductor device shown in FIG. 1. This method can provide the semiconductor device which includes the first and second polysilicon resistance films 8b and 8a having uniform film thicknesses and high dimensional accuracy.

In the semiconductor device according to the first aspect of the invention, the hydrogen ion intercepting film preventing the passage of the hydrogen ion is interposed between the first insulating oxide film and the first polysilicon resistance film and between the second insulating oxide film and the second polysilicon resistance film, so that the hydrogen ion intercepting film intercepts the hydrogen ion, which moves out of the insulating protection film, i.e., final protection film containing a large amount of hydrogen ion and tends to turn upwardly. Consequently, no difference is caused between the resistances of the first polysilicon resistance film and the second polysilicon resistance film. Thus, even if the two insulating oxide films located under the two polysilicon resistance films to be compared have the different thicknesses, they have the equal resistances provided that the polysilicon resistance films have the same pattern. Consequently, the semiconductor device has the output of the value intended in the circuit design.

A semiconductor device according to the second aspect of the invention, the hydrogen ion intercepting film preventing the passage of the hydrogen ion is disposed on the semiconductor substrate to cover the first and second polysilicon resistance films, so that the hydrogen ion supplied from the upper side toward the polysilicon resistance film is completely intercepted. As a result, no difference is caused between the resistances of the first and second polysilicon resistance films. Thus, the output intended in the design can be obtained.

In the semiconductor device according to the third aspect of the invention, the hydrogen ion intercepting film preventing the passage of the hydrogen ion is disposed on the third insulating film which covers the first and second polysilicon resistance films, so that the hydrogen ion supplied from the upper side toward the polysilicon resistance film is completely intercepted. As a result, no difference is caused between the resistances of the first and second polysilicon resistance films.

In the manufacturing method according to the fourth aspect of the invention, the nitrogen ion is implanted into the lowermost layer portion of the polysilicon film, and then the heat treatment is applied thereto, whereby the silicon nitride film is formed in the lowermost layer portion of the polysilicon film. This provides the semiconductor device in which the interface between the polysilicon film and the silicon nitride film is stable, and the bonding force between these films is strong.

In the method according to the fifth embodiment of the invention, the polysilicon films are selectively grown on the respective patterns of the first and second silicon nitride films, whereby the first and second polysilicon resistance films are formed on the first and second insulating oxide films, respectively, so that the pattern of the polysilicon resistance film having the uniform film thickness and the high dimensional accuracy is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device comprising the steps of:

forming a first insulating oxide film and a second insulating oxide film, which continues to said first insulating oxide film and has a thickness larger than that of said first insulating oxide film, on a semiconductor substrate;

forming a polysilicon film, which covers said first and second insulating oxide film, on said semiconductor substrate;

forming a silicon nitride layer in a lowermost layer portion of said polysilicon film by implanting nitrogen ions into said lowermost layer portion of said polysilicon film and then applying a heat treatment thereto;

patterning said polysilicon film and said silicon nitride layer, for forming a first polysilicon resistance film and a second polysilicon resistance film on said first insulating oxide film and said second insulating oxide film, respectively;

forming a first electrode connected to said first polysilicon resistance film and a second electrode connected to said second polysilicon resistance film; and forming an insulating protection film, which covers said first polysilicon resistance film, said second polysilicon resistance film, said first electrode and said second electrode, over said semiconductor substrate.

2. A method according to claim 1, wherein said step of forming said first polysilicon resistance film and said second polysilicon resistance film includes the steps of selectively etching said polysilicon film, using $SF_4$ gas plasma or $CCl_4$ gas plasma, and selectively etching said silicon nitride layer by mixed gas plasma using $CF_4$ and $O_2$.

3. A method of manufacturing a semiconductor device according to claim 1, wherein said silicon nitride layer is approximately 30–100 nm.

4. A method of manufacturing a semiconductor device according to claim 1, further comprising implanting impurities in the polysilicon film to control the resistance of the polysilicon film.

5. A method of manufacturing a semiconductor device according to claim 1, wherein said nitrogen ions are implanted at 500 keV to 5 MeV and said heat treatment is applied at between 500–850 degrees centigrade.

6. A method of manufacturing a semiconductor device according to claim 1, wherein a bond is formed at an interface between said polysilicon film and said silicon nitride layer without impurities disposed at said interface.

7. A manufacturing method of a semiconductor device comprising the steps of:

forming a first insulating oxide film and a second insulating oxide film, which continues to said first insulating oxide film and has a thickness larger than that of said first insulating oxide film, on a semiconductor substrate;

forming a pattern of a first silicon nitride film and a pattern of a second silicon nitride film on said first insulating oxide film and said second insulating oxide film, respectively;

growing a polysilicon film on each of said pattern of said first silicon nitride film and said pattern of said second silicon nitride film, thereby forming a first polysilicon resistance film and a second polysilicon resistance film over said first insulating oxide film and said second insulating oxide film, respectively;

forming a first electrode connected to said first polysilicon resistance film and a second electrode connected to said second polysilicon resistance film; and forming an insulating protection film, which covers said first polysilicon resistance film, said second polysilicon resistance film, said first electrode and said second electrode, over said semiconductor substrate.

8. A method of manufacturing a semiconductor device according to claim 7, wherein forming said pattern of said first silicon nitride film and said pattern of said second silicon nitride film includes the steps of subjecting said first and second silicon nitride films to photolithography, and etching said first and second silicon nitride films.

9. A method of manufacturing a semiconductor device according to claim 7, wherein polysilicon film is selectively grown using a silicon material containing a halogen element.

\* \* \* \* \*